United States Patent
Krämer et al.

(10) Patent No.: US 6,458,712 B2
(45) Date of Patent: Oct. 1, 2002

(54) METHOD FOR REGENERATING SEMICONDUCTOR WAFERS

(75) Inventors: Hans Krämer, Hilbersdorf; Matthias Taubert, Radebeul; Gernot Loibnegger, Langebrück, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/796,209

(22) Filed: Feb. 28, 2001

(30) Foreign Application Priority Data

Feb. 29, 2000 (DE) .......................... 100 10 820

(51) Int. Cl.$^7$ ............................ H01L 21/461
(52) U.S. Cl. .................. 438/749; 438/747; 438/754
(58) Field of Search ............................ 438/16, 86, 690, 438/691, 692, 795, 754, 747, 749

(56) References Cited

U.S. PATENT DOCUMENTS

| 4,631,250 A | | 12/1986 | Hayashi |
| 5,376,157 A | * | 12/1994 | Yam et al. ..................... 51/307 |
| 5,622,875 A | | 4/1997 | Lawrence |
| 6,004,363 A | * | 12/1999 | Pisacane et al. .............. 51/297 |
| 6,117,347 A | | 9/2000 | Ishida |
| 6,287,879 B1 | * | 9/2001 | Gonzales et al. ............. 438/16 |

FOREIGN PATENT DOCUMENTS

| EP | 0 774 776 A2 | 5/1997 |
| JP | 10 027 971 | 1/1998 |

* cited by examiner

*Primary Examiner*—David Nelms
*Assistant Examiner*—Reneé R Barry
(74) *Attorney, Agent, or Firm*—Laurence A. Greenberg; Werner H. Stemer; Ralph E. Locher

(57) ABSTRACT

A process is described for recycling test wafers used for quality control or damaged wafers used in the context of chip production by regenerative removal of the previously applied layers. The method is based on the object of developing a cost-effective, environmentally friendly and time-saving regeneration method. The object is achieved by removing the applied layers by wet blasting using a specific blast material.

9 Claims, No Drawings

METHOD FOR REGENERATING SEMICONDUCTOR WAFERS

BACKGROUND OF THE INVENTION

FIELD OF THE INVENTION

The invention relates to a method for regenerating semiconductor wafers which are used in tests for process and equipment control purposes or whose surfaces are damaged to a greater or lesser extent and which are usually composed of silicon. In the context of the fabrication of circuits on semiconductor wafers, the regeneration taking place by removal of the previously applied layers.

In chip production facilities for fabricating electronic circuits on semiconductor wafers that are preferably composed of silicon, not only the wafers on which the chip structures are produced but also a number of test wafers, usually composed of silicon, pass through the production sequence in order thus to make possible effective process and equipment control. On both wafers, thin layers composed of various materials are applied on the surface, which layers have to satisfy stringent requirements with regard to layer thickness, homogeneity, etc.

Since layer fabrication with patterning thereof is a very difficult and cost-intensive process, attempts are made to regenerate the test wafers, or alternatively severely damaged wafers, and to return them to the process sequence as test wafers.

It is known for silicon layers applied on semiconductor wafers to be processed by various chemical etching methods (see German Patent DE 196 24 315 C2 and Published, Non-Prosecuted German Patent Application DE 197 21 493 A1). On the one hand, the technique of chemical etching is predominantly used to eliminate unevennesses produced in the process of first obtaining the semiconductor wafer from a single-crystal rod (so-called damage). The technique is also used to pattern layers situated on the semiconductor wafer.

In addition to this method, the technique of so-called lapping is also used to eliminate relatively coarse unevennesses of a wafer (see German Patent DE 197 55 705). This involves a mechanical surface treatment in which the semiconductor wafers are processed with rotary movements and a supply of abrasives.

It is furthermore known for the aforementioned methods to be used in the recovery process of wafers used for test purposes. In the case of multilayer and patterned wafers, in particular, chemical etching is complicated and thus highly cost-intensive. Moreover, the required use of different etching solutions and the high water consumption result in a considerable burden on the environment. The lapping method has the disadvantage of being highly time-consuming.

SUMMARY OF THE INVENTION

It is accordingly an object of the invention to provide a method for regenerating semiconductor wafers which overcomes the above-mentioned disadvantages of the prior art methods of this general type, which is cost-effective, environmentally friendly and is less time-consuming.

With the foregoing and other objects in view there is provided, in accordance with the invention, a method for regenerating semiconductor wafers used in tests for process and equipment control purposes and for other semiconductor wafers having damaged surfaces. The method includes the step of regenerating a wafer used in circuit fabrication by removing previously applied layers on the wafer. The previously applied layers are removed by wet blasting using a blast material finely distributed in water and having a predetermined and substantially uniform granularity.

In the case of the method of the type mentioned in the introduction, the problem is solved by virtue of the fact that the applied layers are removed by wet blasting using a blast material which is finely distributed in water and has a predetermined and essentially uniform granularity.

Therefor, the applied layers can be removed cost-effectively because it is no longer necessary to use different etching solutions. At the same time, the burden on the environment is reduced by virtue of reduced pollutant quantities and lower water consumption.

One embodiment provides the use of a blast material predominantly containing silicon dioxide, corundum or mixtures thereof. These substances support the removal effect of the wet blasting on account of their nature which is particularly suitable for the method, in particular through their hardness.

A further embodiment of the invention provides for a blast material having a granularity <100 $\mu$m to be used. This ensures optimization of the removal effect with regard to the uniformity of the removal.

A particularly favorable embodiment provides for the wet blasting to impinge on the plates under a water pressure of between 2–5 bar. This ensures layer removal that is as accurately targeted as possible, under optimized time conditions.

A further embodiment of the invention provides for the wet blasting with the blast material to impinge on the surface at an angle of between 60 and 90 degrees. This also contributes to increased uniformity and target accuracy of the removal process.

In order to meet the surface quality of the semiconductor wafers which is required for applied chip production, a chemical mechanical polishing process and fine cleaning follow the wet blasting. The fine cleaning is carried out using HF, SC1, and SC2.

The method according to the invention is easy to realize and ensures fast and uniform layer removal.

Other features which are considered as characteristic for the invention are set forth in the appended claims.

Although the invention is described herein as embodied in a method for regenerating semiconductor wafers, it is nevertheless not intended to be limited to the description, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENT

Coated semiconductor wafers or semiconductor wafers whose surfaces are damaged enter a method sequence starting with a visual quality inspection, which is followed by a thickness measurement. The wafer is rejected at a thickness >680 $\mu$m. If the parameters for continuing the method are satisfied, the actual regeneration of the wafers begins in such a way that the applied layers are removed by wet blasting using a blast material which is finely distributed in water and has a predetermined and essentially uniform granularity. In this case, blast material containing silicon dioxide, corundum or mixtures thereof and having a granularity <100 μm has proved to be particularly suitable. In this case, the wet blasting with the blast material impinge on the surface under a water pressure of between 2–5 bar and at an angle of between 60 and 90 degrees. The layers on the entire surface are removed by uniformly moving the semiconductor wafer under the blasting jet, or the blasting jet over the wafer.

The method step is repeated, if needed, after a further visual inspection. Provided that the semiconductor wafer is not rejected because predetermined parameters have not been met, the wafer is then subsequently polished, a removal of at least 3 μm being provided.

After the polishing, abrasive dust is removed ("brush clean"). This is followed by a further thickness measurement. In this case, rejection is envisaged at a thickness of less than 665 μm.

Finally, the semiconductor wafers are subjected to fine cleaning. The substances hydrofluoric acid, SC1 and SC2 are employed. The concluding defect density determination is crucial for sorting the wafers in the test wafer store.

We claim:

1. A method for regenerating semiconductor wafers used in tests for process and equipment control purposes and for other semiconductor wafers having damaged surfaces, which comprises the steps of:

regenerating a wafer used in circuit fabrication by removing previously applied layers on the wafer, the previously applied layers being removed by wet blasting using a blast material finely distributed in water and having a predetermined and substantially uniform granularity.

2. The method according to claim 1, which comprises using a substance having a main constituent selected from the group consisting of silicon dioxide, corundum and mixtures of silicon dioxide and corundum as the blast material.

3. The method according to claim 1, which comprises setting the granularity of the blast material to be <100 μm.

4. The method according to claim 1, which comprises setting a water pressure of between 2–5 bar.

5. The method according to claim 1, which comprises setting a predetermined angle at which the wet blasting with the blast material impinges on a surface of the wafer.

6. The method according to claim 5, which comprises setting the predetermined angle at which the wet blasting with the blast material impinges on the surface of the wafer is between 60 and 90 degrees.

7. The method according to claim 1, which comprises subsequently subjecting the wafer that has been subjected to the wet blasting to a chemical mechanical polishing process to produce a surface quality required for applied processes in chip production.

8. The method according to claim 1, which comprises fine cleaning the wafer.

9. The method according to claim 8, which comprises carrying out the fine cleaning step using at least one substance selected from the group consisting of HF, SC1, and SC2.

* * * * *